United States Patent [19]
Kuo

[11] Patent Number: 6,135,792
[45] Date of Patent: Oct. 24, 2000

[54] ELECTRICAL CARD CONNECTOR

[75] Inventor: Ming-Lun Kuo, Taipei, Taiwan

[73] Assignee: Hon Hai Precision Ind. Co., Ltd., Taipei Hsien, Taiwan

[21] Appl. No.: 09/360,771

[22] Filed: Jul. 26, 1999

[30] Foreign Application Priority Data

Dec. 28, 1998 [TW] Taiwan .................................. 87221647

[51] Int. Cl.⁷ .................................................. H01R 13/648

[52] U.S. Cl. ............................................................. 439/92

[58] Field of Search ................................ 439/92, 64, 181, 439/74

[56] References Cited

U.S. PATENT DOCUMENTS 5,357,402 10/1994 Anhalt ........................................ 439/64
5,588,850 12/1996 Pan et al. ................................... 439/92

*Primary Examiner*—Gary F. Paumen
*Attorney, Agent, or Firm*—Wei Te Chung

[57] ABSTRACT

An electrical card connector includes a main body having a pair of arms and a grounding plate attached to each arm. Each arm defines a channel in an inner face thereof for receiving an electrical card and at least one connecting portion respectively on a top surface and a bottom surface thereof. The grounding plate has at least an attaching portion for mating with the corresponding connecting portion of the body, and a tail for contacting the electrical card to facilitate electromagnetic discharge of the card.

1 Claim, 5 Drawing Sheets

ELECTRICAL CARD CONNECTOR

BACKGROUND OF THE INVENTION

1. Field of the Invention

The present invention relates to an electrical card connector, and particularly to an electrical card connector with a grounding plate facilitating electromagnetic discharge of a card inserted into the connector.

2. Description of Prior Art

An electrical card connector which is designed to be withstandable being often mated or unmated by a mating connector should be securely mounted on a printed circuit board (PCB). To achieve a secure connection between the connector and the PCB, the electrical card connector is soldered to the PCB with additional components such as soldering plates 6 shown in FIG. 1. A soldering plate 6 forming a plane 61 is attached to a main body 5 for surface mounting to a printed circuit board. However, the soldering plates 6 are not designed to facilitating electromagnetic discharge of an inserted card. Thus, signal transmission may be adversely affected.

SUMMARY OF THE INVENTION

Accordingly, an object of the present invention is to provide an electrical card connector having a grounding plate facilitating electromagnetic discharge of a card inserted into the connector and serving for securely mounting the connector to a printed circuit board.

In the preferred embodiment of the present invention, the electrical card connector comprises a main body having a pair of arms and a grounding plate attached to each arm. The arms each defines a channel in an inner face thereof for receiving an electrical card and at least one connecting portion respectively on a top surface and a bottom surface thereof. The grounding plate has at least an attaching portion for mating with the corresponding connecting portion of the body, and a tail for contacting the electrical card to facilitate electromagnetic discharge of the card.

BRIEF DESCRIPTION OF THE DRAWINGS

Other objects and advantages of the present invention will be understood from the following description of an electrical card connector according to a preferred embodiment of the present invention shown in the accompanying drawings, in which.

DETAILED DESCRIPTION OF THE PREFERRED EMBODIMENT

Figure 1:
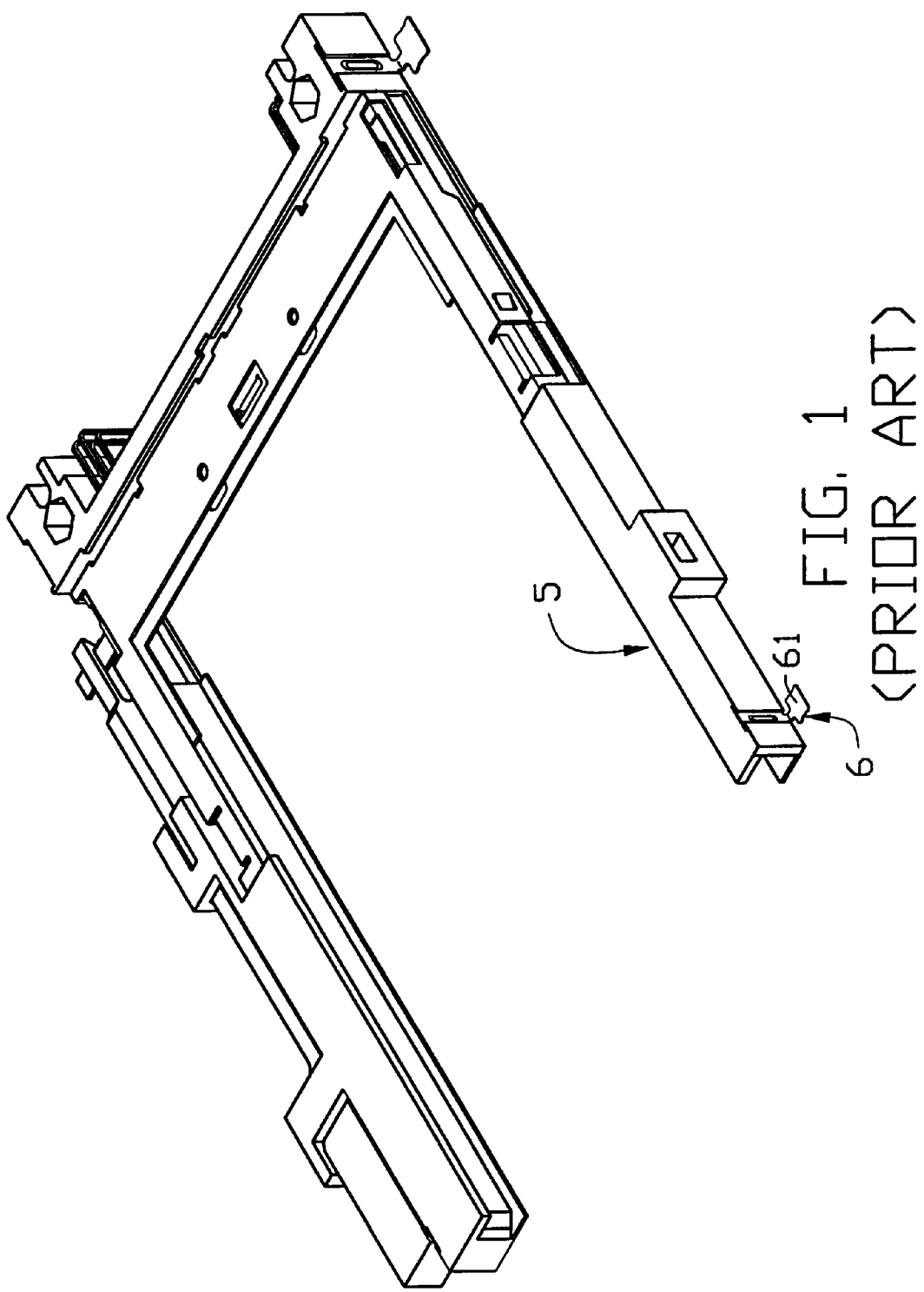
FIG. 1 is a perspective view of a conventional electrical card connector.
Figure 2:
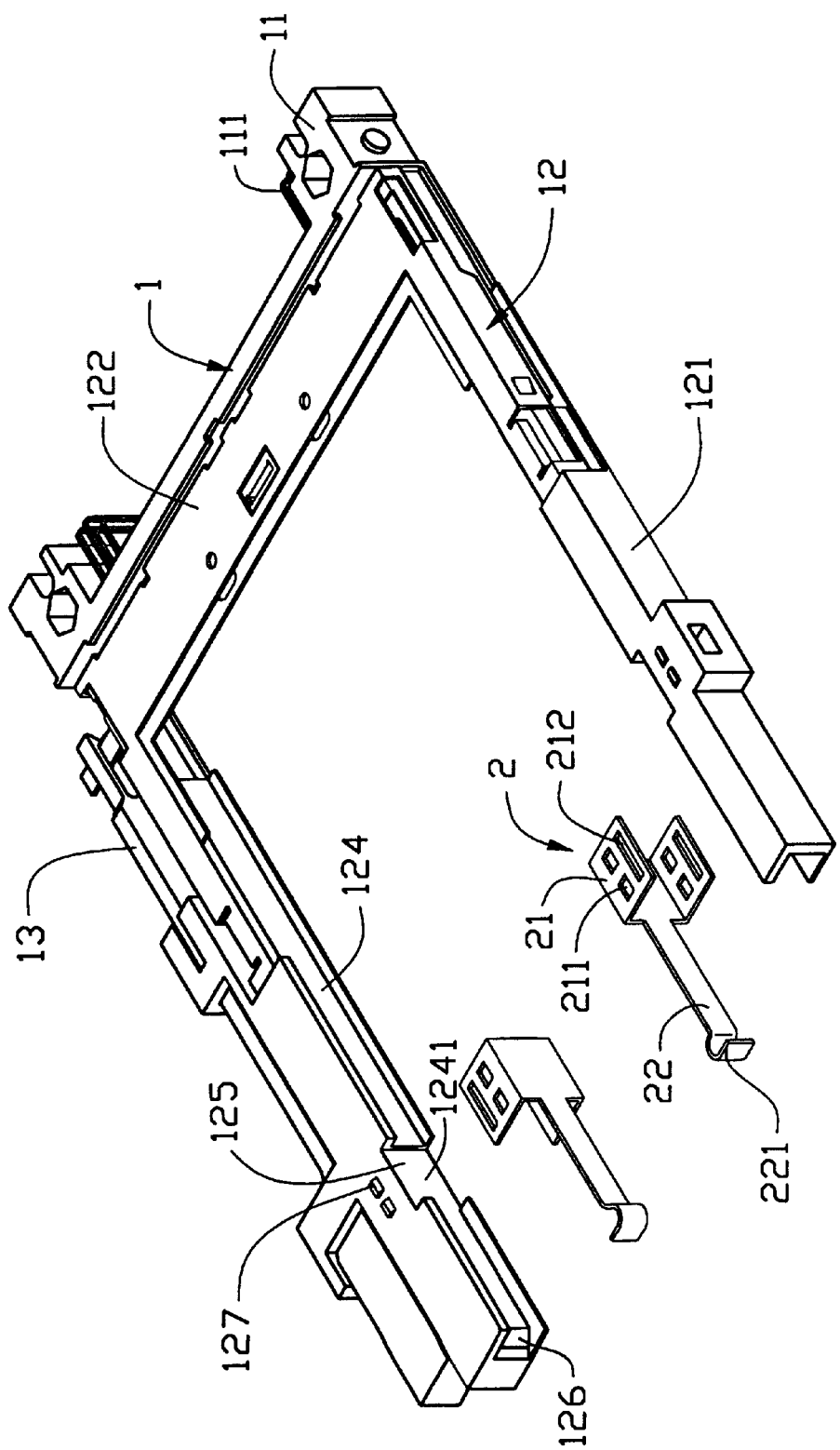
FIG. 2 is an exploded view of an electrical card connector embodying the concepts of the present invention.

Referring to FIG. 2, an electrical card connector of the present invention comprises a main body 1 and a pair of grounding plates 2 attached to the main body 1. The main body 1 includes a header 11 receiving terminals 111 therein, a casing 12 having two arms 121 and a connecting shield 122 connecting the arms 12 to the header 11, and a card ejection mechanism 13 assembled to the casing 12. Each arm 121 defines a channel 124 in an inner face thereof. A recessed surface 1241 is defined in the channel 124, and two cutouts 125 are defined in opposite walls of the arm 121 in communication with the channel 124 proximate an end of the recessed surface 1241. An opposite end of the recessed surface 1241 defines a notch 126. To be a connection portion, a top surface and a bottom surface of each arm 121 each form two protrusions 127 thereon adjacent to the corresponding cutout 125.

The grounding plate 2 includes a U-shaped board 21 which is defined by the upper horizontal plate portion and the lower horizontal plate portion connected by a central vertical plate portion, and a tail 22 extending from the central vertical plate portion of the board 21. The board 21 defines two receiving holes 211 for engaging with the protrusions 127 of the main body 1 and a slot 212 in opposite surfaces thereof. The tail 22 defines an arcuate end 221 for contacting with an electrical card (not shown).

Figure 3:
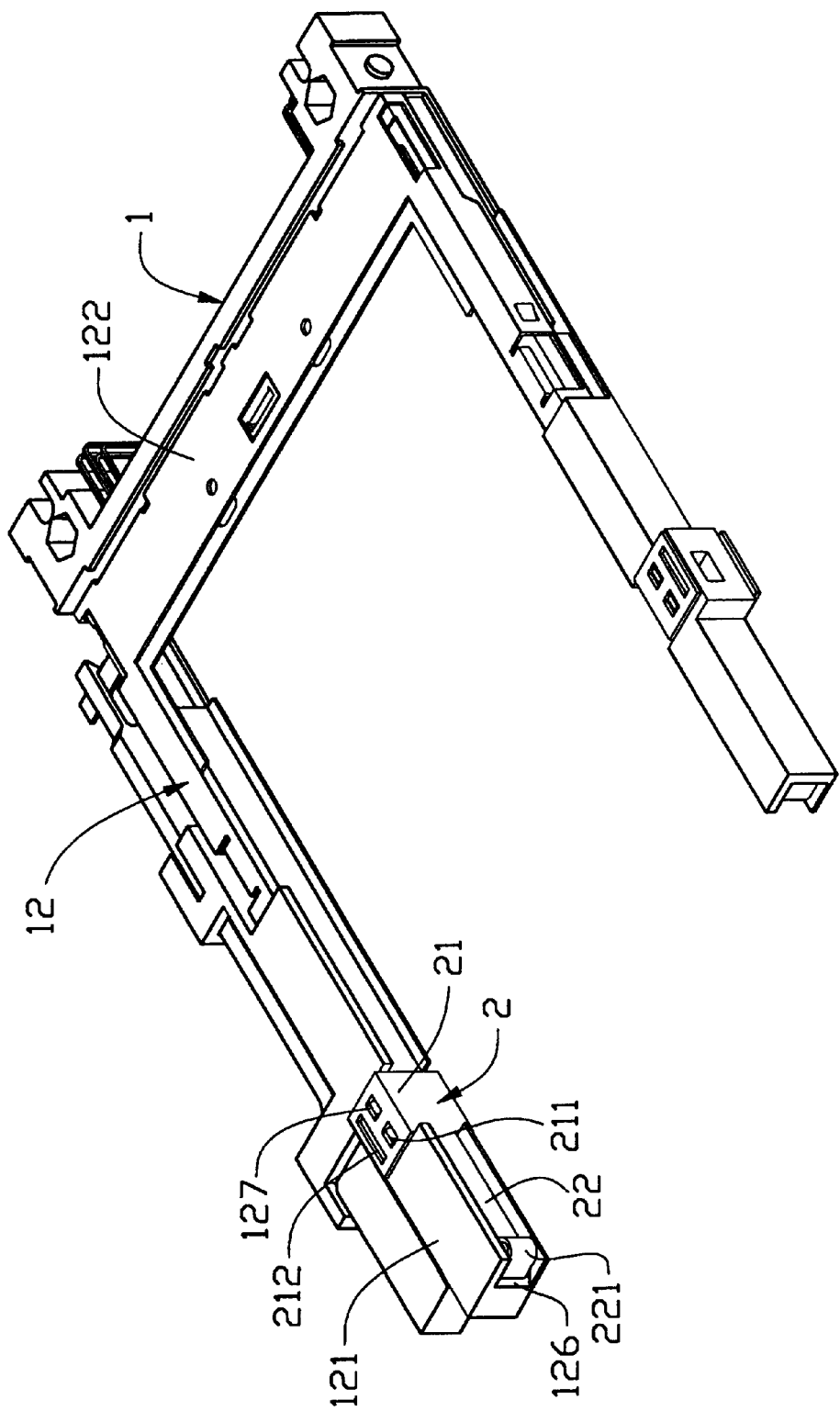
FIG. 3 is an assembled view of FIG. 2.
Figure 4:
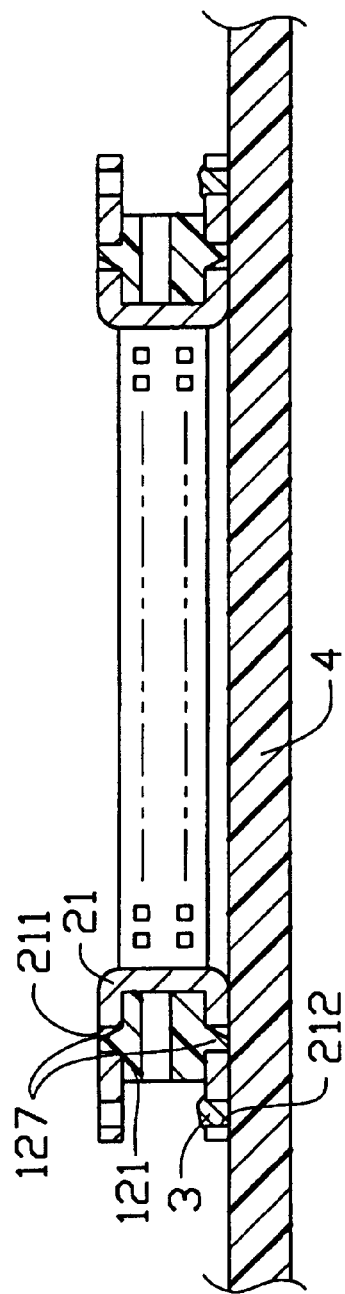
FIG. 4 is a cross-sectional view of the connector mounted to a printed circuit board.

Referring to FIGS. 3 and 4, in assembly, the grounding plate 2 substantially covers the recessed surface 1241 whereby the receiving holes 211 engage with the protrusions 127 of the arms 121 and the arcuate end 221 thereof extends into the corresponding notch 126. The slot 212 is filled with solder 3 for facilitating surface mounting to a printed circuit board 4.

Figure 5:
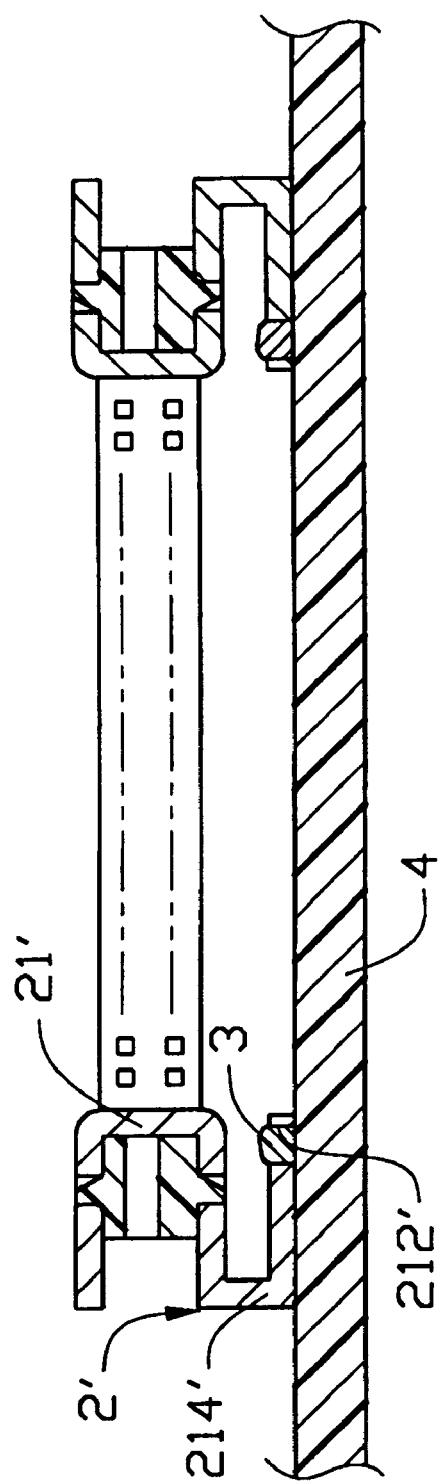
FIG. 5 is a similar view to FIG. 4 but showing an electrical card connector in accordance with a second embodiment of the present invention.

In a second embodiment of the invention as shown in FIG. 5, the U-shaped board 21' of the grounding plate 2' defines an L-shaped standoff 214' extending from an edge thereof. The standoff 214' defines a slot 212' for filled with solder 3 to facilitate surface mounting to the printed circuit board 4.

It is understood that the invention may be embodied in other specific forms without departing from the spirit of the central characteristics thereof. Thus, the present examples and embodiments are to be considered in all respects as illustrative and not restrictive, and the invention is not to be limited to the details given herein.

What is claimed is:

1. An electrical card connector assembly comprising:

a main body having a pair of arms, each of said arms defining a channel in an inner face thereof for receiving an electrical card therein, one of said arms defining a connection portion;

a grounding plate attached to said one of the arms, said grounding plate including a tail extending into the channel for engagement with the card, an attaching portion for fastening to the connection portion, and a plate portion positioned under and spaced from the corresponding arm, said plate portion defining a slot extending therethrough and exposed to an exterior above said plate portion; and a printed circuit board positioned under the main body and connected to the main body through the plate portion wherein solder is filled within the slot.

* * * * *